(12) United States Patent
Okawa et al.

(10) Patent No.: US 6,656,662 B1
(45) Date of Patent: Dec. 2, 2003

(54) METHOD OF FORMING A POLYMER MOLECULE CHAIN

(75) Inventors: Yuji Okawa, Tokyo (JP); Masakazu Aono, Tokyo (JP)

(73) Assignees: Japan Science and Technology Corporation, Saitama (JP); Riken, Saitama (JP)

( * ) Notice: Subject to any disclaimer, the term of this patent is extended or adjusted under 35 U.S.C. 154(b) by 0 days.

(21) Appl. No.: 09/980,690

(22) PCT Filed: Aug. 28, 2000

(86) PCT No.: PCT/JP00/05800

§ 371 (c)(1),
(2), (4) Date: Oct. 26, 2001

(87) PCT Pub. No.: WO01/96447

PCT Pub. Date: Dec. 20, 2001

(30) Foreign Application Priority Data

Jun. 13, 2000 (JP) .................................. 2000-176833
Jul. 26, 2000 (JP) .................................. 2000-224970

(51) Int. Cl.[7] .............................. G03C 5/00; G03F 7/00
(52) U.S. Cl. ..................... 430/296; 430/35; 430/942; 250/310; 250/396 R; 250/492.1
(58) Field of Search ......................... 430/35, 296, 942; 250/310, 396 R, 492.1

(56) References Cited

U.S. PATENT DOCUMENTS

| 5,008,127 A | * | 4/1991 | Ogawa ....................... 427/299 |
| 5,885,753 A | * | 3/1999 | Crooks et al. ............... 430/325 |
| 2002/0127491 A1 | * | 9/2002 | Weiss et al. ................. 430/296 |

FOREIGN PATENT DOCUMENTS

| JP | 2142025 | 5/1990 | ........... H01L/29/28 |
| JP | 4035066 | 2/1992 | ........... H01L/29/28 |
| JP | 4169199 | 6/1992 | ....... H01L/21/3205 |
| JP | 6013379 | 1/1994 | ....... H01L/21/3205 |
| JP | 7279982 | 10/1995 | ....... H01L/21/3205 |
| JP | 9129637 | 5/1997 | ....... H01L/21/3205 |

OTHER PUBLICATIONS

Nanostructure Patterning C.R.K.Marrian and Co.W.; Proc IEEE, v79, #8 (1991), pp. 1149–1158.*

Shen et al., Atomic–Scale Desorption Through Electronic and Vibrational Excitation Mechanisms, Science, vol. 268, Jun. 16, 1995, p. 1542, 1590–1592.

Eigler et al., Positioning Single Atoms with a Scanning Tunnelling Microscope, Nature, vol. 344, Issue No. 6266, Apr. 5, 1990, p. 524–526.

Heckl et al., Electropolymerization of Glutaraldehyde Observed by . . . , Journal of Vacuum Science & Technology B, Second Series, vol. 9, No. 2, Part 1, Mar./Apr. 1991, p. 1159–1161.

Ma et al., Ultrahigh Density Data Storage from Local Polymerization . . . , Applied Physics letters, vol. 73, No. 22, Nov. 30, 1998, p. 3303–3305.

Keyes, The Future of Solid–State Electronics, Physics Today, Aug. 1992, p. 42–48.

Yang et al., Writing and Reading at Nanoscale with a Scanning Tunnelling Microscope, American Chemical Society, vol. 11, No. 1, Aug. 5, 1994, p. 211–213.

Gordon et al., Overview of Nanoelectronic Devices, Proceedings of the IEEE, vol. 85, No. 4, Apr. 1997, p. 521–540.

* cited by examiner

*Primary Examiner*—Mark F. Huff
*Assistant Examiner*—K Sagar
(74) *Attorney, Agent, or Firm*—Gary C Cohn PLLC

(57) ABSTRACT

This invention relates to a method of forming a polymer chain of a desired length in a thin film comprising a monomer having a multiple bond in a desired position. This invention is a method of polymerizing a monomer to form the polymer chain by applying a pulse voltage to the thin film comprising the monomer having a multiple bond in a desired position. The polymer chain may be polymerized to a desired length in a desired position. The pulse voltage, may be applied using the probe of a scanning tunnel microscope. The length of the monomer may be controlled using a defect formed on the above-mentioned thin film as an end point of the polymer chain.

21 Claims, 6 Drawing Sheets

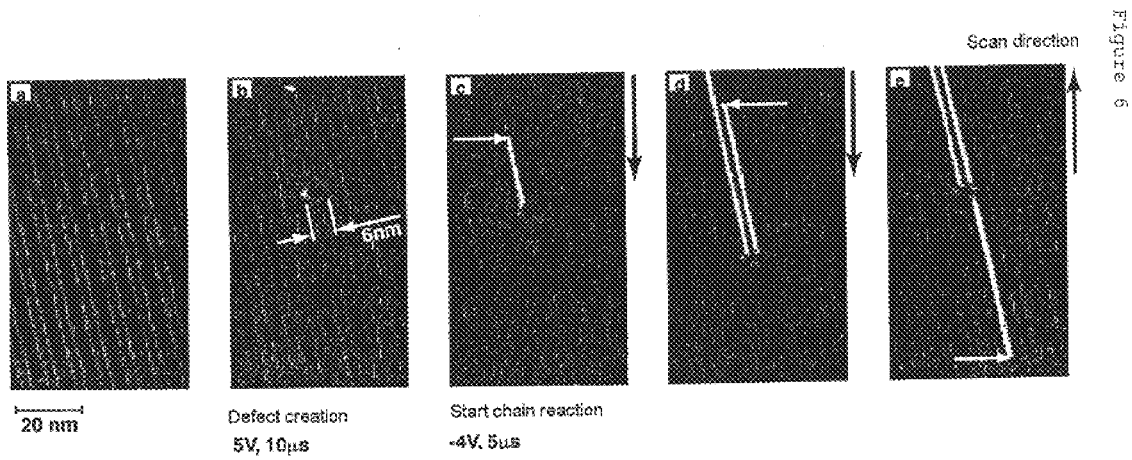

METHOD OF FORMING A POLYMER MOLECULE CHAIN

CROSS-REFERENCE TO RELATED APPLICATION

This application is a national phase application of, and claims benefit of, PCT application no. PCT/JP00/05800, filed in the Japanese Patent Office on Aug. 28, 2000.

TECHNICAL FIELD OF THE INVENTION

This invention relates to a method of forming a polymer chain having a desired length and a predetermined position in a thin film comprising monomers comprising multiple bonds.

PRIOR ART

Due to the advances made in ultra fine processing of silicone semiconductors by lithography, the performance of electronic calculators continues to advance. However, at the size of the metal-metal oxide-semiconductor (MOS) transistors currently in use, there are theoretical limitations on the ultra fine processing which is possible. This is due to the fact that, as the size becomes smaller, the physical properties of the material can no longer be maintained and quantum dynamic effects begin to appear. It is thought that when the size of a transistor becomes smaller than approximately 0.1 $\mu$m (100 nm)) it will no longer function (Keyes, R. W., Phys. Today 45, 42–48 (1993)).

Therefore, in order that electronic calculators can continue to advance in the 21st century, new devices must be developed based on new principles, and quantum effect devices using quantum dynamics or molecular devices using organic molecules have been proposed (e.g., Goldhaber-Gordon, D., Montemerlo, M. S., Love, J. C., Opiteck, G. J. & Ellenbogen, and Proc. IEEE 85,521–540 (1997)).

These are devices of the order of nanometers, smaller than the present MOx transistors by about two orders of magnitude, and nanosize patterning techniques are therefore required to produce them. One type of nanosize patterning technique wherein individual atoms are removed or attached and moved using a scanning tunnel microscope (STM) probe, has been actively studied in the past ten years or so. There are many such reports in the literature, for example a report where xenon atoms were displaced to draw the characters IBM (Eigler, D. M. & Schweizer, and E. K. Nature 344, 524–526 (1990)) or an example where hydrogen was removed from a silicone surface terminated by hydrogen (Shen, T.-C. et al., Science 268, 1590 (1995)).

In multilayer films or liquids comprising monomer organic molecules., there are several reports where polymers have been locally produced by applying a voltage pulse to an STM probe (Heckl, W. M. & Smith, D. P. E., J.Vac.Sci.Technol. B9, and 1159–1161 (1991), Yang, R., Evans, D. F. & Hendrickson, W. A., and Langmuir 11, 211–213 (1995), and Ma, L. P., Yang, W. J., Xie, S. S. & Pang, S. J., Appl.Phys-.Lett. 73, 3303–3305 (1998). These reports indicate that polymerization reactions can be induced by the STM probe, but as they are only local reactions, the techniques could not be used to draw nanostructures instantaneously over a wide region of the surface.

Problems to be Solved by the Invention

The aforesaid prior art techniques produce nanosize structures by controlling atoms one by one, and are therefore considered very useful to manufacture a new device and verify its functions. However, as the atoms must be moved one by one, the forming rate is slow and it is difficult to manufacture plural devices over a wide range which is required for commercialization. Further, one of the reasons why it is difficult to implement quantum effect devices or molecular devices is that there are no useful techniques for forming interconnections between individual devices or between devices and external electrodes.

This invention therefore aims to provide a method of resolving the above problems inherent in the prior art by providing a method for forming nanostructures at high speed, and by providing a nanoscale interconnection technique.

Means to Solve the Problem

This invention induces a chain polymerization reaction by applying a stimulation by means of a pulse voltage to an organic molecule thin film comprising a monomer having multiple bonds arranged in rows, allowing a structure as long as one molecule to be produced at a desired position by only one operation with an electrode (for example, an STM probe), and allowing a polymer chain having a predetermined length to be produced in the thin film, e.g., by forming defects in the thin film.

This invention is a method for producing a polymer chain by polymerizing a monomer by applying a pulse voltage to a thin film comprising the monomer having multiple bonds which have been aligned in rows so that unsaturated bonds are adjacent to one another. The polymer chain can be polymerized to a predetermined length at the predetermined position. Further, the length of the monomer can be controlled using a defect formed on the thin film as an end point of the polymer molecule chain.

c is a diagram showing a sequence model.

FIG. 4a is a diagram showing an STM image after external radiation (sample bias=10V), b-e show enlarged images (sample bias: b +0.5V, c +0.1V, d −0.1V, e −0.5V), f is a diagram showing a polymer structure model.

Figure 5:
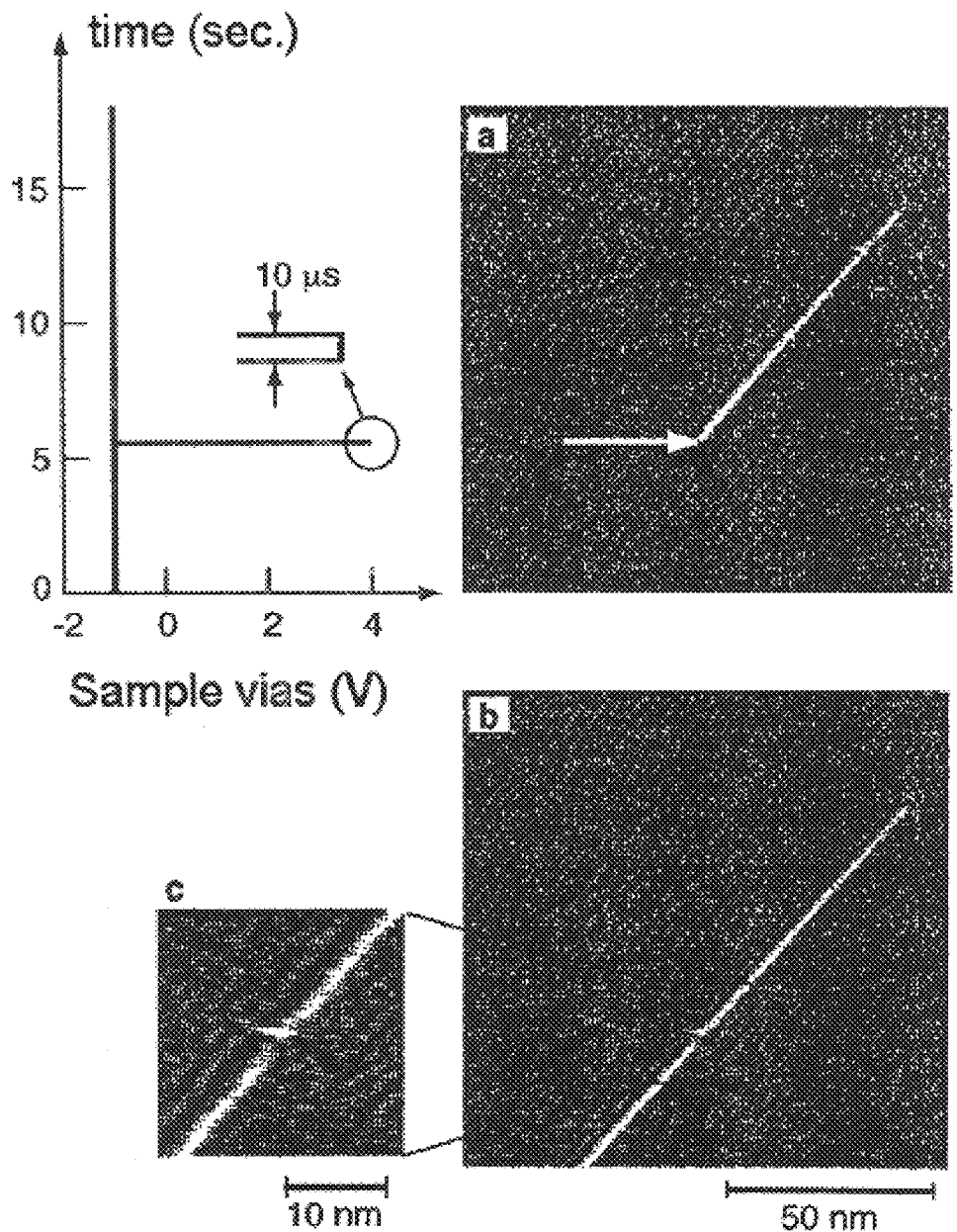

FIG. 5a is an STM photograph where a pulse voltage is applied in the direction of the arrow during scanning of the monomer molecule film from bottom to top.

b is an STM photograph observed at the same point immediately after a.

c is an enlarged view of the part to which the pulse is applied.

FIG. 6 is an STM photograph wherein the length of a nanosize linear polymer is controlled by a defect formed artificially on the molecular layer of 10,12-nanocosadienic acid.

DESCRIPTION OF THE PREFERRED EMBODIMENTS

Figure 1:
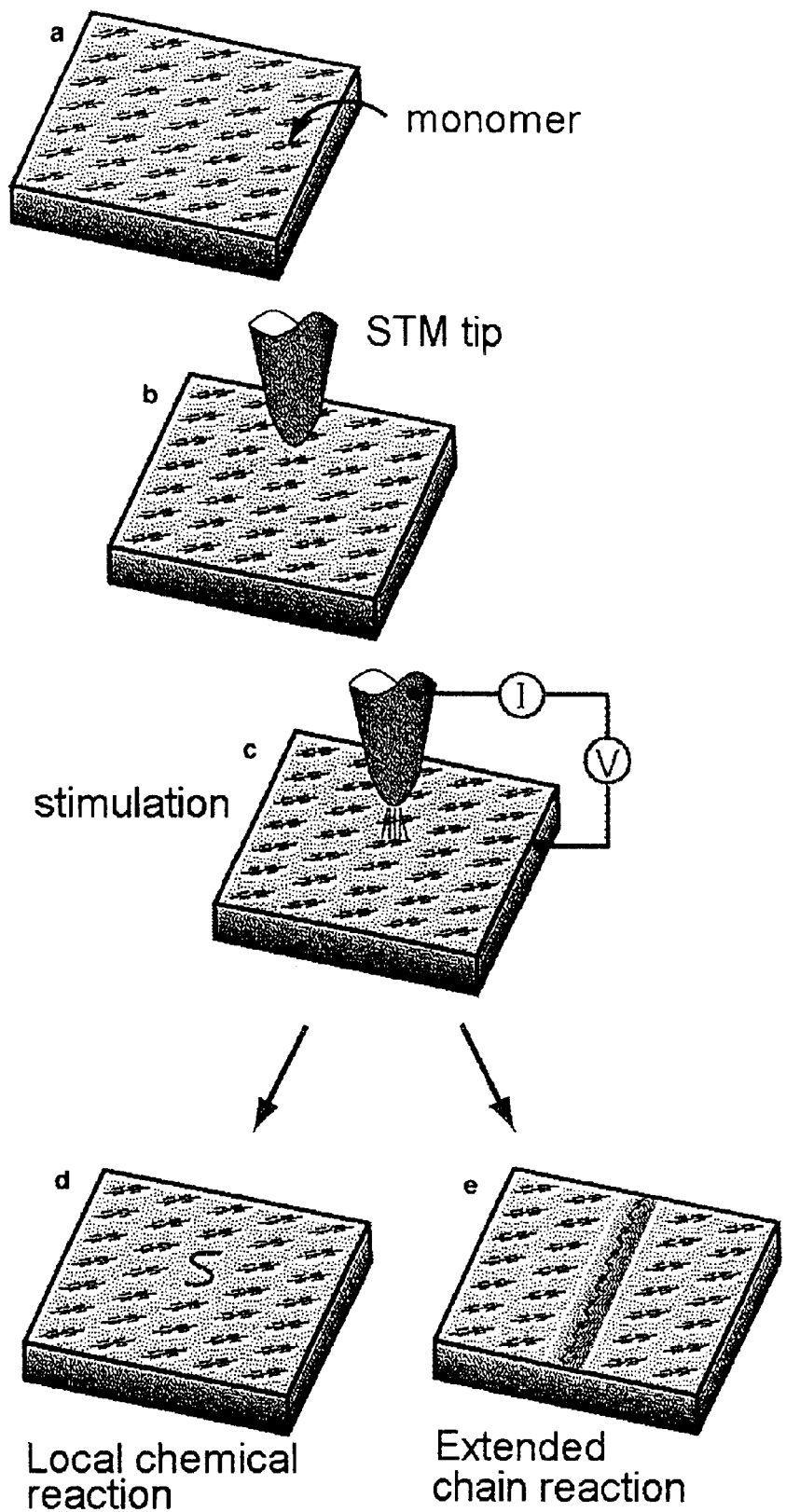
FIG. 1 is a drawing showing an experimental chain polymerization reaction induced by STM in a single molecule adsorption film.

FIG. 1 schematically shows the method of applying a pulse voltage to a thin film comprising a monomer having multiple bonds (i.e., double bonds and triple bonds). For example, using a diacetylene compound on a graphite surface, the same reaction as a photopolymerization can be induced by applying a pulse voltage to a probe, and a polymer chain having a width of one molecule and a length of several hundred nanometers can be produced in one operation. First, the monomer molecules are arranged regularly in rows on the surface as shown in FIG. 1a using the self-aligning property of the molecules. The STM probe is then brought to an arbitrary position at which it is desired to induce a reaction as shown in FIG. 1b, and the reaction is started by applying stimulation by means of a pulse voltage (FIG. 1c). In this case, according to the chosen system and conditions, it can also be terminated by a local reaction as shown in FIG. 1d.

In this invention, a polymer with a long chain can be produced as shown in FIG. 1e. In this way, a long nanostructure can be instantaneously drawn at a desired position by one operation of the probe.

Figure 2:
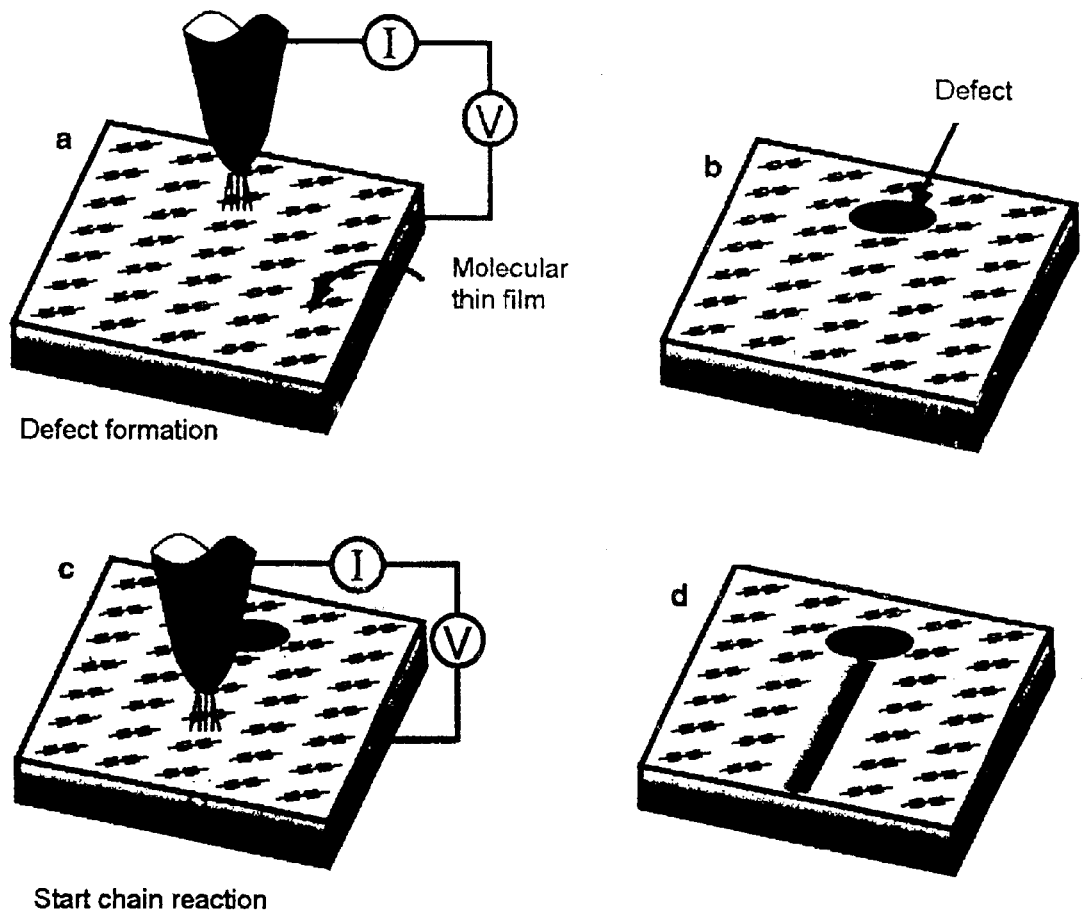
FIG. 2 is a diagram showing how the length of the polymer molecule chain is controlled by producing a defect using a probe at a point where it is desired to stop the reaction.

According to this invention, as shown in FIG. 2, a defect is placed using the probe at points where it is desired to stop the reaction (a, b), and the reaction can be stopped at a desired length (d) by starting the chain polymerization reaction by applying the following pulse voltage to the probe at that point (c).

Thus, in this invention, a polymer chain of a desired length can be created on a thin film in a desired position.

In this invention, "monomer" is a molecule which has a multiple bond (a double bond or triple bond), and is a molecule which has the capability to induce a polymerization reaction. Examples of such molecules are alkenes with a carbon-carbon double bond, alkynes with a carbon-carbon triple bond, especially diacetylene compounds comprising two carbon-carbon triple bonds, diolefin compounds comprising two carbon-carbon double bonds, and compounds containing a cyano group (carbon-nitrogen triple bond), etc.

This diacetylene compound (general formula: R—C≡C—C≡C—R', where R, R' are substituents) is a system which undergoes solid state polymerization by ultraviolet irradiation or heat (Wegner, G., Z.Natureforsch.B24, 824–832 (1969), Wegner, G., Makromol.Chem.154, 35–48 (1972)), the reaction being expressed by n R—C≡C—C≡C—R'→(=RC—C≡C—CR'=)$_n$. The substituent groups R, R' are preferably 10,12-pentacosadienic acid ($CH_3(CH_2)_{11}C≡C—C≡C(CH_2)_8COOH$) Tieke, B., Lieser, G. & Wegner, G., J.Polym.Sci.Polym.Chem.Ed.17, 1631–1644 (1979)), which has been studied as the Langmuir-Blodgett (LB) film which photopolymerizes, or 10,12-nanocosadienic acid.

In this invention, "thin film" is a layer containing a part in which the above monomers are arranged, and it may also contain inactive substances other than the monomer such as binders or solvents.

There is no limitation on the thickness of the thin film which may range from one molecule of monomer to 1 cm.

In this invention, in the thin film, it is necessary for the monomer comprising multiple bonds to be arranged so that unsaturated bonds are adjacent. Herein, the term "arrangement" means that unsaturated bonds of the monomer are located somewhat nearby, thus, polymerization reactions can occur one after another between one unsaturated bond with other unsaturated bonds in the vicinity by applying the stimulus of a pulse voltage. Therefore, this monomer does not necessarily need to align in a specific form, such as a straight line shape. The extent to which the monomer of this invention can be said to be "arranged" depends on the closeness of the unsaturated bonds, and this depends on the monomer as it naturally varies according to the reactivity of the unsaturated bonds, but it is generally considered that the distance between unsaturated bonds should not exceed 10A and preferably not exceed 6A. In the case of diacetylene compounds, it is considered that this distance should be 4–6A, preferably 4.9+−0.2A, and in the case of double bonds, about 2–3A.

In this invention, monomers of the same kind may be arranged, or two or more types of monomers may be arranged. For example, if two types of monomers, 10,12-pentacosadienic acid and 10,12-nanocosadienic acid, are mixed, they will arrange to make a pair.

By aligning the two molecules to make a pair, intermolecular distances which would not be possible in each of the molecules alone may be obtained.

In this invention, it is also possible to form a thin film on a solid substrate to control the arrangement of the monomer. By forming the thin film on the substrate, the monomer molecules arrange themselves spontaneously due to interaction between monomer molecules, and interaction between the monomer and the substrate.

The monomer may be arranged mainly due to mutual interaction of monomer molecules using a substrate which has a weak interaction with the monomer (for example, when mounting 10,12-pentacosadienic acid on a graphite substrate), or a substrate may be used which bonds strongly to the monomer, i.e., a substrate with a lattice constant matched to the bonding length of the polymer chain (for example, when a molecule with diacetylene groups and thiol groups (SH) bonds to an Au (111) surface). By mixing two or more kinds of monomers, or mixing with molecules other than the monomers, the interaction between molecules may be varied and the arrangement may be changed.

As the mutual interaction of the substrate with the molecules should be weak, graphite may be used. There are several reports in the literature wherein the arrangement and photopolymerization of diacetylene compounds on graphite has been observed by STM (Rabe, J. P., Buchholz, S.& Askadskaya, L., and Synth.Met.54,339–349 (1993)), Grim, P. C. M. et al., Angew.Chem.Int.Ed.Engl.36, 2601–2603 (1997), Takami, T. et al., Angew.Chem.Int.Ed.Engl.36, and 2755–2767 (1997), however there are still no reports of polymerization reactions using a probe.

In order to produce the above thin film, the monomer liquid may be placed on the substrate, or a solution of the monomer in a solvent may be placed on the substrate. When placing a solution on the substrate, the monomer may be aligned at the interface of the solvent and the substrate, or the solvent may be evaporated to leave only the monomer on the substrate. Alternatively, the solution in which the monomer is dissolved may be dripped onto another liquid such as water, and the solvent evaporated to form a monomer thin film on the water or other liquid. The monomer thin film on the water or other liquid may be used as it is, or may be transferred to another substrate. Or, a thin film may be formed by exposing the substrate to the vapor of the monomer in the gaseous phase or a vacuum.

Figure 3:
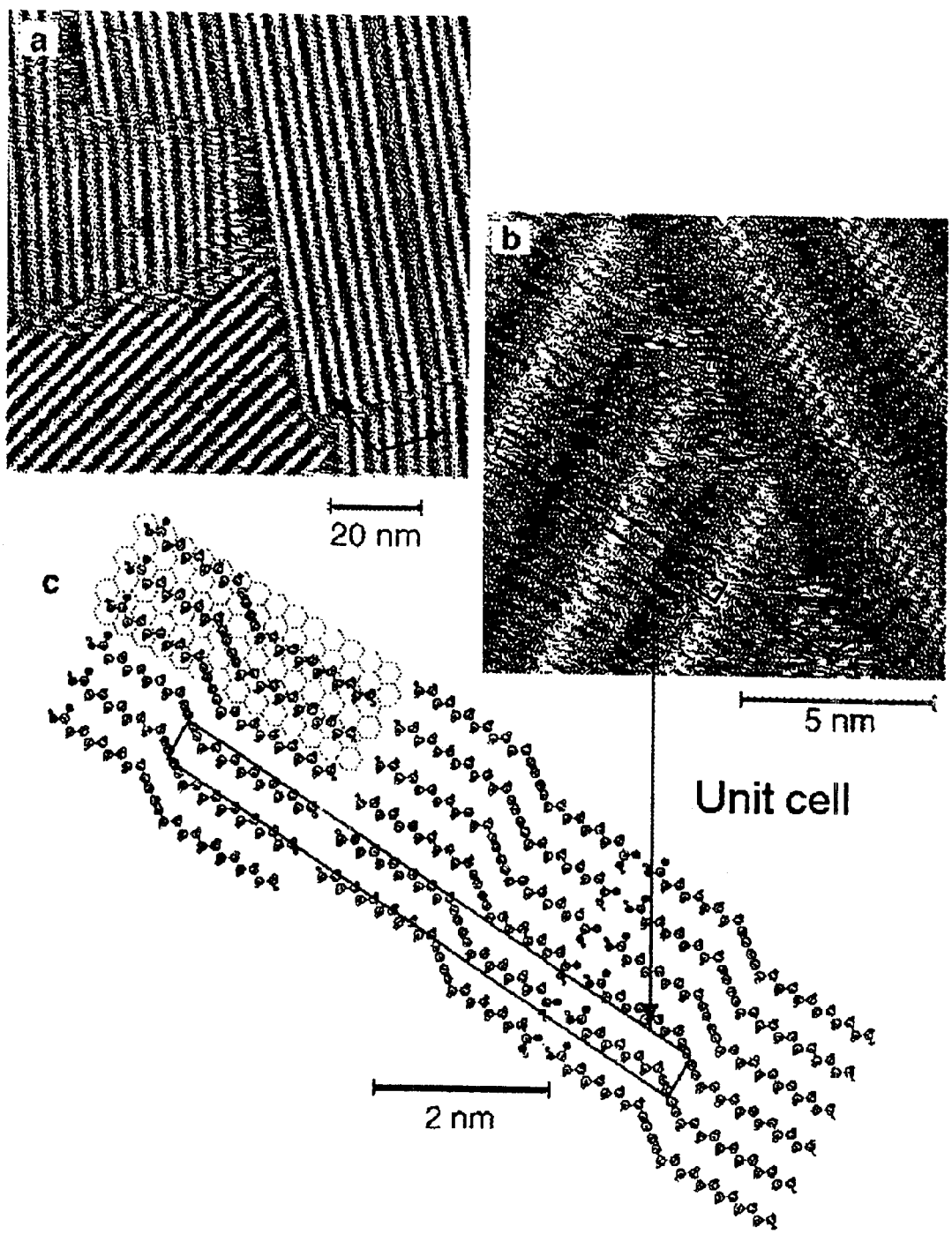
FIGS. 3a, b show STM images of 10,12-pentacosadienic acid molecules arranged in rows on a graphite substrate.

For example, if a monomer molecular film of a 10,12-pentacosadienic-acid molecule is made to form on a graphite substrate and observed by STM, the molecules will have arranged spontaneously as shown in FIG. 3a. The straight lines which appear bright are arranged regularly so that large (3.8 nm) intervals alternate with narrow (3.0 nm) intervals. The direction of these straight lines must be one of six directions which make an angle of approximately +−27° to the direction of the lattice vector of graphite. This has suggested that the orientation of the molecular sequence can be controlled by the substrate structure. FIG. 3b is an observation over a narrower range wherein individual molecules can be observed. From such an image, the arrangement model shown in FIG. 3c was proposed. That is, each molecule is a plane shape parallel to the graphite surface, and the direction of the $(CH_2)_n$ chain is parallel to the direction of the graphite lattice. In a large number of alkanes, fatty acids and acetylene molecules which are absorbed on graphite substrates, the $(CH_2)_n$ chain is parallel to the direction of the graphite lattice, (Grim, P. C. M. et al., Angew. Chem. Int. Ed. Engl. 36, 2601–2603 (1997), Rabe, J. P. & Buchholz, S., and Science 253,424–427 (1991), Hibino, M., Sumi, A. & Hatta, I., Jpn.J.Appl.Phys.34, 3354–3359 (1995), etc.). The area which appears bright in STM corresponds to the triple bond of the molecule, and when the COOH groups of an unsymmetrical molecule face each other, a narrow interval and a large interval occur. It is thought that there is a high possibility of COOH groups directly making hydrogen bonds, and also of water molecules entering to make hydrogen bonds. In 10,12-octadecadienic acid on graphite which Rabe and others observed, all the molecules are arranged in rows in the same direction without causing association of COOH groups (Rabe, J. P., Buchholz, S. & Askadskaya, L., Synth.Met.54, and 339–349 (1993)), but the difference in this arrangement may depend on the presence or absence of water molecules. The distance between molecules in a sequence was 0.47 nm.

In this invention, an electrode is installed in a desired position in or on top of the thin film in which the monomer is arranged, and a pulse voltage is applied. The polymerization of the monomer is caused by applying the pulse voltage. This pulse voltage preferably supplies a voltage change of 0–50V in 0–1 seconds. It is usually applied to the thin film by a needle-like electrode. The electrode may be the probe of a scanning probe microscope.

Regardless of the mechanism of polymerization, two or more molecules of the monomer bond together by a chain reaction to give a polymer molecule. The length of the polymer chain thus formed may be in the range 1 nm–10 cm, and it may be linear or curved.

In this invention, polymerization of the monomer can be induced in a desired position, this position being any position at which the polymerization reaction in the above-mentioned thin film is initiated, and it can be specified to a precision of 100 $\mu$m or higher. The control can be performed as follows. The electrode is placed in or on top of the thin film, or at the desired position, and the above pulse voltage is applied. The electrode may be the probe of a scanning probe microscope. In order to install the electrode in the desired position, the electrode may be observed under the scanning probe microscope using the electrode as the probe, and the position of the electrode controlled using the drive mechanism of the scanning probe microscope.

In this invention, a polymerization of desired length can be induced, the length of the polymer being about 1 nm–10 cm, and it can be controlled as follows. Before applying the pulse voltage at the predetermined position, a defect is formed on a sequence in which the polymerization proceeds with the predetermined position as a starting point. This defect may be considered as the end of the polymer chain which is produced. One end only of the polymer chain may be specified by forming the defect on only one side of the predetermined position, or both ends of the polymer chain may be specified by forming the defect on both sides of the above predetermined position.

The defect on this thin film can be formed as follows. The electrode may be placed on the thin film and the defect formed by applying a pulse voltage at that point. The electrode may be the probe of a scanning probe microscope. The electrode used may be the same as or different from that used for the electrode which initiates the polymerization reaction.

A defect may be formed also by bringing the tip of a needle into contact with the thin film or substrate. The needle may be the same as or different from the electrode used for initiating the polymerization reaction. The defect may be formed by mixing substances other than the above-mentioned monomer into the thin film. The defect may be formed also by irradiating the thin film with light or electrons.

Figure 4:
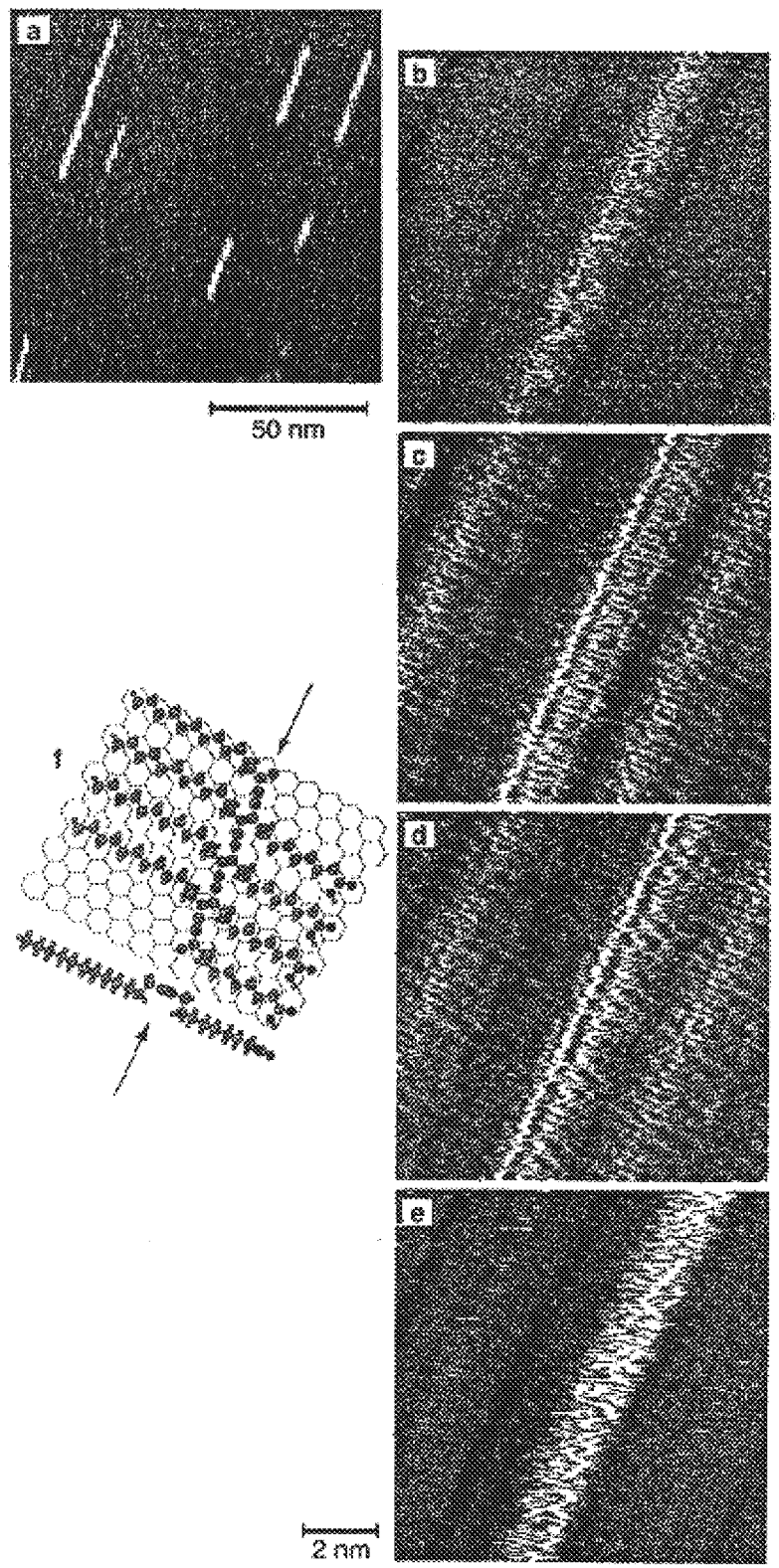

In order for the polymerization reaction to proceed continuously for a long time, it is necessary that the intermolecular distance before and after the reaction does not change. Diacetylene compounds are known to undergo solid state polymerization topochemically (i.e., without changing the crystal structure) in bulk (Wegner, G., Z.Natureforsch.B24,824–832 (1969), Wegner, G., Makromol.Chem.154, 35–48 (1972)), and these substances are therefore suited for the purpose of this invention. In an actual reaction, as shown in FIG. 4, the polymerization occurs almost without any change in the arrangement of side chains before and after the reaction. However, even in the case of diacetylene compounds, there are examples wherein the intermolecular distance and orientation do change before and after a photopolymerization reaction, as in the case of an isophthalic acid derivative on a graphite substrate (Grim, P. C. M. et al., and Angew. Chem. Int. Ed. Engl. 36, 26012603 (1997)), so selection of the side chain substituents R, R' is also important.

The method of this invention may be used for forming devices on a nanometer scale, such as quantum devices and molecular devices, or for creating interconnections connecting devices or devices and external electrodes. The polymer chain itself may be used as interconnection material. The electrical conductivity may be increased by doping with other substances and molecules. Other molecules may be bonded with the polymer chain to modify it or other substances may be selectively adsorbed onto parts of the polymer chain, and the resulting polymer can also be used as a template for making still higher order structures. When the reaction starts due to the pulse voltage, the chain reaction spreads, so the chain reaction itself can also be used as a signal transmission means.

Hereafter, this invention will be illustrated referring to the embodiments, but these are not intended to limit the invention in any way.

COMPARATIVE EXAMPLE 10,12-pentacosadienic acid (Tokyo Chemical Industries Co. Ltd.) was dissolved in chloroform to a concentration of about 150 mg/l, and this solution was dropped at about 3.5 microl/cm$^2$ on the:surface of pure water manufactured using a Millipore water-purifying device. After the chloroform evaporated, the molecular film on the water surface was transferred by attaching cleaved, highly oriented sintered graphite (HOPG, from Advanced Ceramics, ZYH grade) horizontally to the water surface. Observation by a scanning tunnel microscope was performed using a NanoScope E STM from Digital Instruments. A Pt-Ir chip was used for the probe and the image was observed in a constant current mode in the atmosphere. Ultraviolet light irradiation was performed using a low pressure mercury lamp (Spectronics handy UV lamp EF-280 C/J) of wavelength 254 nm, 1.3 mW/cm$^2$.

Irradiation of the monomer molecular film by ultraviolet light (lambda=254 nm) was performed for 20 minutes ($2.0 \times 10^4$ photons/nm$^2$), and the STM image after a photopolymerization reaction was induced is shown in FIG. 4a (sample bias=−10V). The polymer produced by the photopolymerization reaction is observed as a bright linear structure. In the early stage of 20 minutes or less of optical irradiation, the number of polymers produced is roughly proportional to the irradiation time, and the reaction probability is approximately $10^{-8}$ reactions/photon.

Polymer enlargement images observed at different bias voltages (b:+0.5V, c:+0.1V, d:−0.1V, e:−0.5V) are shown in FIGS. 4b–e. It is seen that the width of the polymer is one molecule. The orientation of the polymer is the same as the orientation of the monomer molecule sequence, namely, about 27 degrees inclined from the direction of the graphite lattice. Therefore, supposing all the $(CH_2)_n$ in the polymer is in the trans configuration and is in the same plane, the direction of the $(CH_2)_n$ chain will shift from the direction of the graphite lattice. However, the orientation of the side chain $(CH_2)_n$ in the polymer is no different from the orientation of the $(CH_2)_n$ chain of the monomer molecule, as can be seen from FIGS. 4b–d.

In FIG. 4c, weak Moire patterns appear due to a mismatch with the substrate lattice in the side chain for both the polymer sequence and monomer sequence, and the fact that they both have the same period shows that the arrangement of side chains does not change even if polymerization occurs. From this, a model may be considered wherein, as a C—C bond rotates and shifts from a plane shape, the direction of the $(CH_2)_n$ chain is aligned with the direction of the graphite lattice, as shown for example in FIG. 4f.

In the model of FIG. 4f, the polymer skeleton is about 0.14 nm higher than the side chain $(CH_2)_n$. If a C—C bond rotates and shifts from the trans configuration, the energy of the molecule will become a little unstable. In fact, it was observed that the polymer molecule easily dissociated and disappeared during the STM scan. The reason why the polymer looks bright under STM compared with the monomer is not only due to the fact that the polymer skeleton is higher as in the model of FIG. 4f, but is probably due also to the fact that the electron state changed due to the long conjugated system. It is reported that in a 10,12-tricosadienic-acid multilayer film, as the π electrons are non-localized and form a band, the ionization energy decreases by 1.6 eV from the 6.7 eV of the monomer to the 5.1 eV of the polymer (Nakahara, H. et al., and Chem.Phys.118,123–131 (1987)). This HOMO energy change is considered to be reflected in the change of light and darkness of the STM image.

Example 1

The raw material and the molecular film were prepared as in the comparative example. Instead of the voltage from a Nanoscope E controller, the output from a function synthesizer (WF1945 by Enu Efu (NF) Circuit Design Block) was connected to the sample bias voltage terminals so that a pulse voltage could be applied between the probe and the sample in STM.

FIG. 5a shows the application of a +4V, 10 microsecond pulse voltage to the sample in the position shown by the arrow during an STM scan of the monomer molecular film. A bright linear structure identical to the polymer produced by photopolymerization appeared in the instant when the pulse voltage was applied. The linear structure stopped at the domain boundary of the monomer arrangement. It is seen that, when STM observation was repeated at the same position, the reaction proceeded to both sides from the position at which the pulse was applied, as shown in FIG. 5b. As the bias voltage dependence of the STM image of the bright linear structure showed an identical variation to that of the polymer produced by photopolymerization (FIGS. 4c–e), it is evident that the application of the pulse voltage to the STM probe induced a chain polymerization reaction.

An enlarged image of the region around the position in which the pulse voltage was applied is shown in FIG. 5c. Although a defect was produced in the position in which the pulse was applied, this is not necessarily observed. The reaction occurs when a pulse voltage of either +4V or −4V is applied to the sample, and if a 10 microsecond pulse voltage is applied, it occurs with a probability of about once in 10 pulses. The current is about 120 nA(s) while the pulse voltage is applied, so the reaction probability is estimated to be about 10–8 reactions/electron. This is almost the same as the reaction probability due to ultraviolet light (λ=254 nm and hv=4.88 eV). Also, when a pulse voltage of +−3V is applied, although the reaction probability becomes smaller by about one order of magnitude, a polymerization reaction can still occur. The length of the polymer produced in one reaction has been observed to attain 250 nm or longer, and a structure having a width of one molecule and a length of several hundred nanometers can be produced in one STM operation.

Example 2

The same experiment as that of Embodiment 1 was performed, except that 10,12-pentacosadienic acid was replaced by 10,12-nanocosadienic acid (Tokyo Chemical Industries Co. Ltd.).

FIG. 6 shows control of the length of the nanosize linear polymer by defects formed artificially on the molecular layer of 10,12-nanocosadienic acid. a shows the initial state wherein the 10,12-nanocosadienic-acid molecule is arranged regularly on a graphite substrate. b shows the image after forming a defect, and applying a 5V, 10 microsecond pulse. In this case, an elliptical hole of about 6 nm×4 mm is made. In c, a −4V, 5 microsecond pulse was applied in the arrow part while scanning from top to bottom, to initiate a chain reaction. The reaction has stopped at the defect. In d, a polymer was also formed in the adjoining sequence. In e, a pulse was applied in the arrow part while scanning from bottom to top, and a polymer was formed also on the lower side. In this way, three or four interconnections can be connected to an object of about 5 nm.

What is claimed:

1. A method of polymerizing a group of adjacent monomers to form a polymer chain by applying a pulse voltage to at least one point of a thin film comprising a monomer having multiple bonds arranged so that unsaturated bonds are adjacent to each other.

2. The method as defined in claim 1, wherein said polymer chain is polymerized to a desired length in a desired position.

3. The method as defined in claim 2, wherein said pulse voltage is applied using a probe of a scanning tunnel microscope.

4. The method as defined in claim 2, wherein the length of said monomer is controlled using a defect formed on said thin film as an end point of said polymer chain.

5. The method as defined in claim 1, wherein said pulse voltage is applied using a probe of a scanning tunnel microscope.

6. The method as defined in claim 5, wherein the length of said monomer is controlled using a defect formed on said thin film as an end point of said polymer chain.

7. The method as defined in claim 1, wherein the length of said group of adjacent monomers is controlled using a defect formed on said thin film as an end point of said polymer chain.

8. The method of claim 7, wherein said pulse voltage is applied using a probe of a scanning tunnel microscope.

9. The method as defined in claim 1, wherein said monomer is arranged on a substrate which has a weak interaction with the monomer.

10. The method as defined in claim 9, wherein said substrate is graphite.

11. The method as defined in claim 1, wherein said monomer is arranged on a substrate which bonds strongly to the monomer and the substrate has a lattice constant matched to the bonding length of the polymer chain.

12. The method as defined in claim 11, wherein said monomer has diacetylene groups and thiol groups, and said substrate is an Au (111) surface.

13. A method of polymerizing a monomer to form a polymer chain comprising forming a thin film of the monomer on a substrate such that at least one group of monomer molecules is aligned in a row ouch that multiple bonds on adjacent monomers within the group are adjacent to each other and separated by a distance of 10 Å or less, and applying a pulse voltage to a point in the row of aligned monomer molecules to polymerize the monomer molecules in said row to form a polymer chain.

14. The method of claim 13 wherein the group of monomer molecules is of a desired length and at a desired position on the substrate.

15. The method of claim 13 wherein the pulse voltage is applied using a probe of a scanning tunnel microscope.

16. The method of claim 13 wherein the length of said polymer chain is controlled by forming a defect in said row of monomer molecules to form an end point for said polymer chain.

17. The method of claim 16 wherein multiple bonds on adjacent monomers within the groups are separated by a distance of 6 Å or less.

18. The method of claim 13 wherein the substrate has a weak interaction with the monomer.

19. The method of claim 18 wherein the substrate is graphite.

20. The method of claim 13, wherein said monomer is arranged on a substrate which bonds strongly to the monomer and the substrate has a lattice constant matched to the bonding length of the polymer chain.

21. The method as defined in claim 20, wherein said monomer has diacetylene groups and thiol groups, and said substrate is an Au (111) surface.

* * * * *